(12) United States Patent
Wakabayashi et al.

(10) Patent No.: US 10,229,847 B2
(45) Date of Patent: Mar. 12, 2019

(54) SUBSTRATE TRANSFER CHAMBER AND CONTAINER CONNECTING MECHANISM WITH LID OPENING MECHANISMS

(71) Applicant: Tokyo Electron Limited, Tokyo (JP)

(72) Inventors: Shinji Wakabayashi, Yamanashi (JP); Keisuke Kondoh, Yamanashi (JP); Sensho Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/428,896

(22) Filed: Feb. 9, 2017

(65) Prior Publication Data

US 2017/0154799 A1    Jun. 1, 2017

Related U.S. Application Data

(63) Continuation of application No. 14/507,724, filed on Oct. 6, 2014.

(30) Foreign Application Priority Data

Oct. 7, 2013    (JP) ................................ 2013-210090

(51) Int. Cl.
*H01L 21/677* (2006.01)

(52) U.S. Cl.
CPC .. *H01L 21/67772* (2013.01); *H01L 21/67769* (2013.01); *B65G 2201/0297* (2013.01)

(58) Field of Classification Search
CPC ................................................ H01L 21/67772
See application file for complete search history.

(56) References Cited

U.S. PATENT DOCUMENTS

| 6,582,182 | B2 | 6/2003 | Whalen | |
| 6,955,517 | B2* | 10/2005 | Nulman | ............ H01L 21/67028 414/222.01 |
| 9,834,378 | B2* | 12/2017 | Bonora | ................ B65G 1/0407 |
| 2008/0152466 | A1* | 6/2008 | Bonora | ................ B65G 1/0407 414/222.07 |
| 2011/0076120 | A1 | 3/2011 | Itou | |

FOREIGN PATENT DOCUMENTS

| JP | 2004-006804 A | 1/2004 |
| JP | 2010-118385 A | 5/2010 |
| KR | 10-2010-0095371 A | 8/2010 |
| TW | 547451 U | 8/2003 |

* cited by examiner

*Primary Examiner* — Gerald McClain

(57) ABSTRACT

A substrate transfer chamber for unloading the substrates from the containers includes a housing-shaped main body and a plurality of container connecting mechanisms to which the containers are connected. In the main body, some of the container connecting mechanisms are arranged on top of one another in a height direction of the main body.

5 Claims, 5 Drawing Sheets

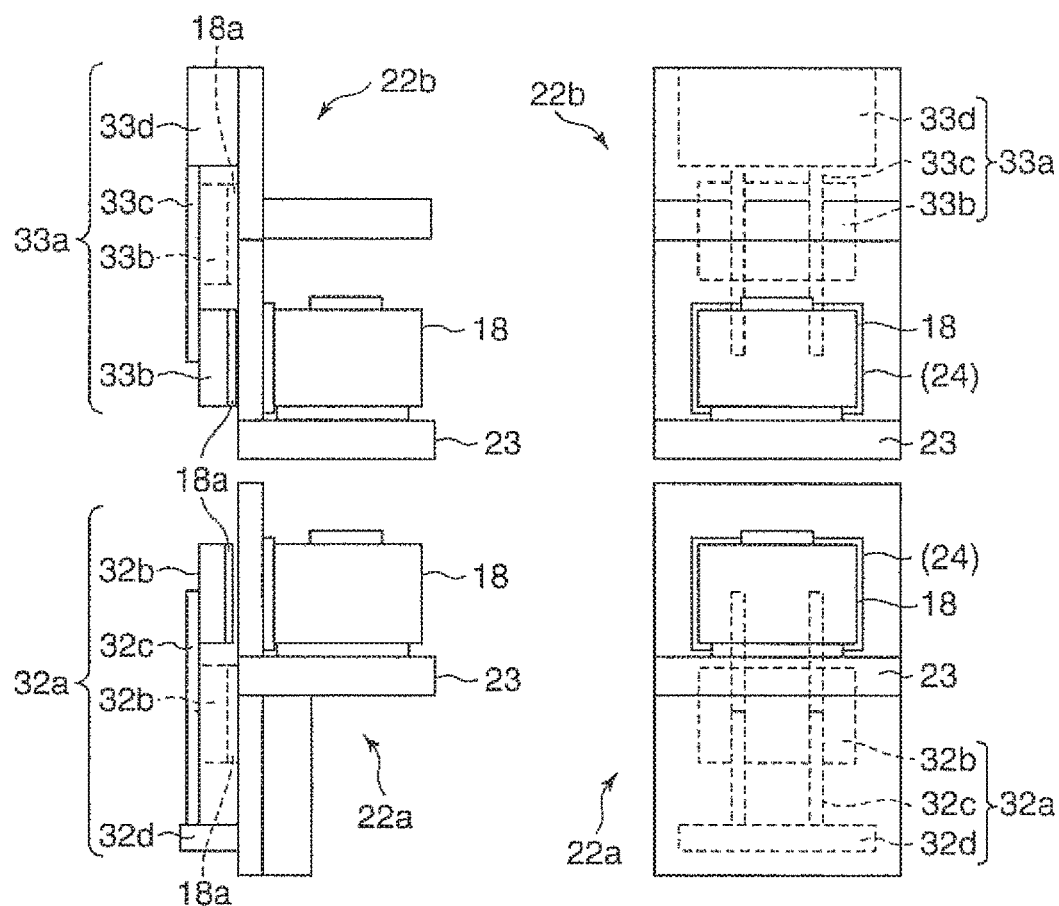

SUBSTRATE TRANSFER CHAMBER AND CONTAINER CONNECTING MECHANISM WITH LID OPENING MECHANISMS

CROSS-REFERENCE TO RELATED APPLICATIONS

This application is a continuation application of the co-pending U.S. patent application Ser. No. 14/507,724, filed on Oct. 6, 2014, which claims priority to Japanese Patent Application No. 2013-210090, filed on Oct. 7, 2013. The entire contents of foregoing applications are incorporated herein by reference for all purposes.

FIELD OF THE INVENTION

The present invention relates to a substrate transfer chamber and a container connecting mechanism.

BACKGROUND OF THE INVENTION

A plasma processing system for performing plasma processing on a substrate, e.g., a semiconductor wafer (hereinafter, simply referred to as "wafer") includes a process module serving as a vacuum plasma processing chamber, and a loader module serving as an atmospheric transfer chamber for loading and unloading the wafer into and from a container, e.g., a front opening unified pod (FOUP), accommodating a plurality of wafers.

In the plasma processing system, the wafer is unloaded from the FOUP connected to a container connecting mechanism (load port) of the loader module and then loaded into the process module through the loader module, a load-lock module serving as an atmosphere/vacuum switchable chamber and a transfer module serving as a vacuum transfer chamber.

In consideration of the plasma process efficiency, the plasma processing system generally includes a plurality of process modules. Therefore, the loader module has a plurality of, e.g., three, load ports to simultaneously load wafers into the respective process modules. The load ports are arranged linearly on one side surface of a housing-shaped loader module (see, e.g., Japanese Patent Application Publication No. 2006-261456).

Recently, the number of process modules of the plasma processing system increases in view of throughput improvement. For example, there is developed a plasma processing system including six process modules. In such a plasma processing system, different processes may be performed in the respective process modules depending on the modes of the respective process modules. Specifically, the process modules and wafer lots are made to correspond to one another, and each of the process modules may process only wafers in a lot corresponding thereto. In that case, wafers are transferred between a load port and a single process module without being sequentially transferred between the process modules. Thus, in order to minimize a period of time during which the process modules are being empty, load ports are preferably provided such that the number of the load ports is equal to or greater than the number of process modules. In the above plasma processing system, it is preferable that the loader module has at least seven load ports.

However, in the case of arranging at least seven load ports linearly on one side surface of the loader module, a foot print of the loader module is increased, which makes it difficult to install the plasma processing system in a clean room. Especially, scaling up of a wafer diameter, specifically, from 300 mm to 450 mm, is expected, so that the problem of the increase in the foot print of the loader module becomes more significant.

SUMMARY OF THE INVENTION

In view of the above, the present invention provides a substrate transfer chamber and a container connecting mechanism, capable of reducing increase in a foot print.

In accordance with an aspect of the present invention, there is provided a substrate transfer chamber, to which a plurality of containers accommodating substrates is connected, for unloading the substrates from the containers, including: a housing-shaped main body; and a plurality of container connecting mechanisms to which the containers are connected. In the main body, some of the container connecting mechanisms are arranged on top of one another in a height direction of the main body.

BRIEF DESCRIPTION OF THE DRAWINGS

The objects and features of the present invention will become apparent from the following description of embodiments, given in conjunction with the accompanying drawings, in which:

FIGS. 4A and 4B show a configuration of a pair of an upper and a lower load port shown in FIGS. 2 and 3, wherein FIG. 4A is a side view and FIG. 4B is a front view;

FIGS. 5A and 5B schematically show a configuration of a modification of the upper load port, wherein FIG. 5A is a rear view and FIG. 5B is a side view;

DETAILED DESCRIPTION OF THE EMBODIMENTS

Hereinafter, embodiments of the present invention will be described with reference to the accompanying drawings which form a part hereof.

Figure 1:
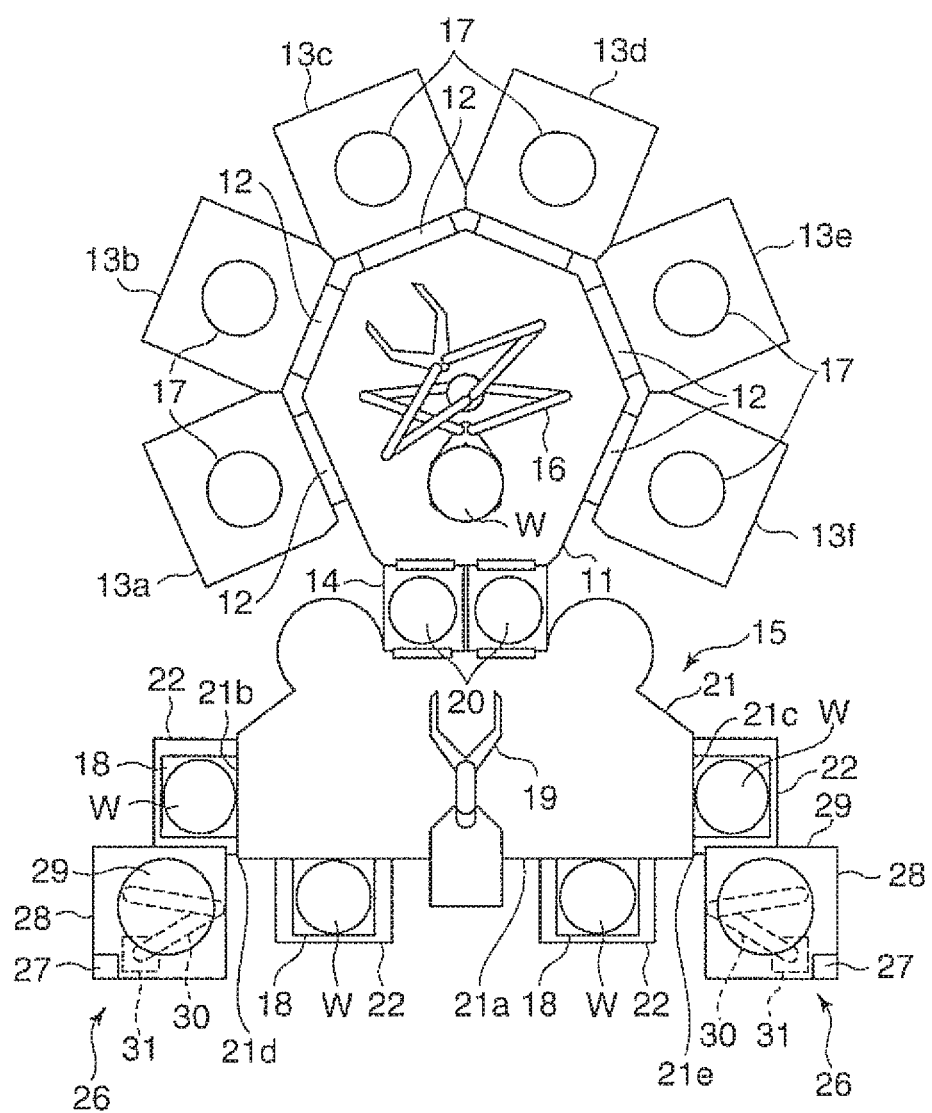
FIG. 1 is a top view schematically showing a configuration of a substrate processing system including a substrate transfer chamber (loader module) in accordance with an embodiment of the present invention.

FIG. 1 is a top view schematically showing a configuration of a substrate processing system including a substrate transfer chamber (loader module) in accordance with an embodiment of the present invention. In FIG. 1, components in the system are illustrated to be seen through for convenience of explanation.

In FIG. 1, a substrate processing system 10 includes: a transfer module 11 serving as a vacuum transfer chamber formed in a substantially heptagonal shape when seen from the top; six process modules 13a to 13f, serving as vacuum plasma processing chambers, which are arranged radially around the transfer module 11 and connected to the transfer module 11 through gate valves 12; two load-lock modules 14, serving as atmosphere/vacuum switchable chambers, which are connected to one side surface of the transfer module 11 where the process modules 13a to 13f are not connected; and a loader module 15, serving as an atmospheric transfer chamber, which is connected to the load-lock modules 14 at the opposite side to the transfer module 11.

The transfer module 11 has therein a transfer mechanism 16 for transferring a wafer W between the process modules 13a to 13f or between the process modules 13a to 13f and the load-lock modules 14. A pressure in the transfer module 11 is depressurized to a predetermined vacuum level.

Each of the process modules 13a to 13f has a single stage 17 for mounting thereon the wafer W. A pressure in the respective process modules 13a to 13f is depressurized to a predetermined vacuum level. In the respective process modules 13a to 13f, a predetermined plasma process, e.g., dry etching, is performed on the wafer W mounted on the stage 17.

The loader module 15 has a transfer robot 19 for transferring the wafer W between the load-lock modules 14 and FOUPs 18, each accommodating a plurality of wafers W. A pressure in the loader module 15 is maintained at an atmospheric pressure.

Each of the load-lock modules 14 has a stage 20 for mounting thereon the wafer W. The inner space of each load-lock module 14 can be switched between an atmospheric environment and a depressurized environment. For example, when the wafer W is transferred by using the transfer robot 19 in the loader module 15, the inner space of the load-lock module 14 is switched to the atmospheric environment to communicate with the inner space of the loader module 15. Further, when the wafer W is transferred by using the transfer mechanism 16 in the transfer module 11, the inner space of the load-lock module 14 is switched to the depressurized environment to communicate with the inner space of the transfer module 11. In other words, the inner spaces of the load-lock modules 14 are switched between the atmospheric environment and the depressurized environment, and the wafer W is transferred between the transfer module 11 and the loader module 15 via the load-lock modules 14.

Figure 2:
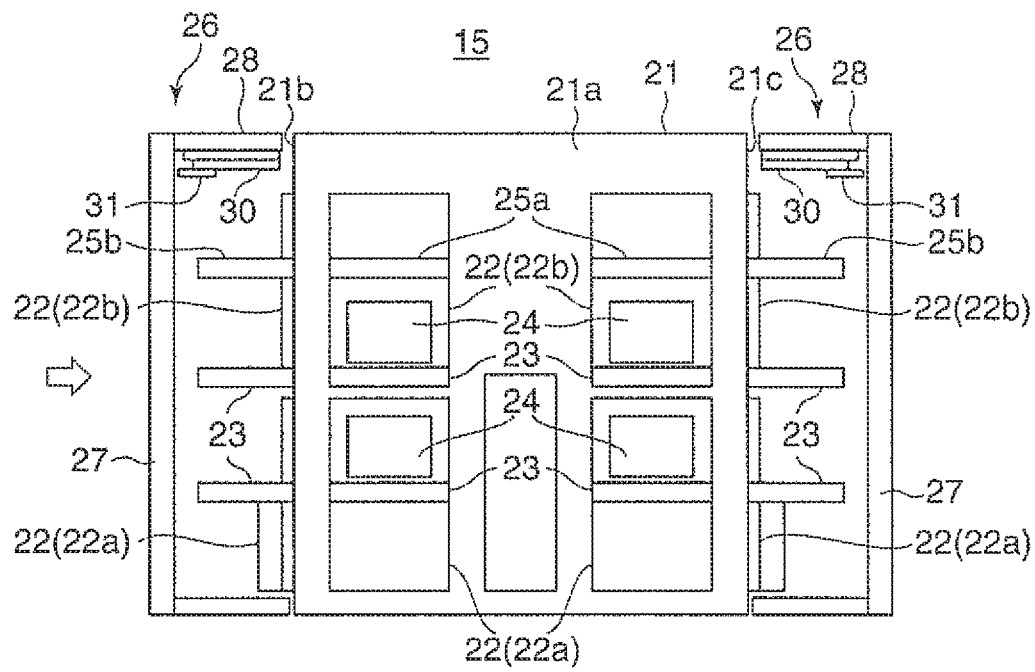
FIG. 2 is a front view schematically showing a configuration of the loader module shown in FIG. 1.
Figure 3:
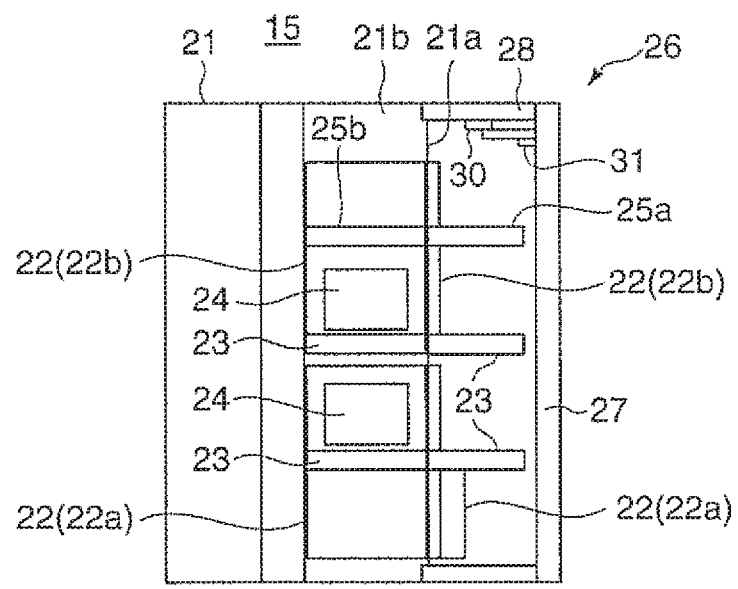
FIG. 3 is a side view schematically showing the configuration of the loader module shown in FIG. 1, as seen from a direction of an arrow in FIG. 2.

FIG. 2 is a front view schematically showing a configuration of the loader module shown in FIG. 1. FIG. 3 is a side view schematically showing the configuration of the loader module, as seen from a direction of an arrow in FIG. 2.

In FIGS. 2 and 3, the loader module 15 further includes a main body 21 having a hexagonal housing shape when seen from the top, and a plurality of load ports 22 each serving as a container connecting mechanism for connecting the FOUP 18 to the main body 21.

The load ports 22 are disposed at a side surface 21a of the loader module 15 opposite to a side surface of the loader module 15 where the load-lock modules 14 are connected and at two side surfaces 21b and 21c adjacent to the side surface 21a. Further, the load ports 22 are arranged on top of one another in a height direction of the main body 21 (hereinafter, simply referred to as "height direction"). In the present embodiment, the load ports 22 are classified into lower load ports 22a and upper load ports 22b, for convenience. Two pairs of lower and upper load ports 22a and 22b are disposed at the side surface 21a, and one pair of lower and upper load port 22a and 22b is disposed at each of the side surfaces 21b and 21c.

Each of the load ports 22 includes a plate-shaped stage 23 extending in a horizontal direction from the main body 21, and a FOUP connecting port 24 (container connecting port) that opens at a portion of the main body 21 so as to face the FOUP 18 mounted on the stage 23. The FOUP connecting port 24 is generally blocked by a shutter (not shown) or the like. However, when the FOUP 18 is mounted on the stage 23 and connected to the FOUP connecting port 24, the FOUP connecting port 24 opens and a lid 18a of the FOUP 18 which will be described later faces the FOUP connecting port 24.

A port 25a or a buffer 25b extending in a horizontal direction from the main body 21 is provided above each pair of lower and upper load ports 22a and 22b. Each buffer 25b is configured to temporarily place thereon the FOUP 18 transferred by a FOUP transfer unit 26 to be described later.

The loader module 15 includes two FOUP transfer units 26 (container transfer units) that are disposed at a corner 21d (see FIG. 1) formed by the side surfaces 21a and 21b of the main body 21 and a corner 21e (see FIG. 1) formed by the side surfaces 21a and 21c of the main body 21.

Each of the FOUP transfer unit 26 includes: a column 27 standing upright in the height direction; a base 28 attached at the column 27 and movable in the height direction; a rotation base 29 disposed at the base 28 and rotatable on a horizontal plane; a SCARA type arm 30 installed at a position offset from the center of the rotation base 29; a coupling portion 31 provided at the leading end of the arm 30 and to be coupled to an upper portion of the FOUP 18. The FOUP transfer unit 26 transfers the FOUP 18 between the load ports 22, the ports 25a and the buffers 25b by the vertical movement of the base 28, the rotation of the rotation base 29, and the extension/contraction of the arm 30.

FIGS. 4A and 4B show the configuration of the pair of the lower and the upper load port in FIGS. 2 and 3. FIG. 4A is a side view and FIG. 4B is a front view. In FIGS. 4A and 4B, the main body is omitted. In FIG. 4A, a lid-open-state is indicated by a dashed line. In FIG. 4B, a lower lid-opening mechanism and an upper lid-opening mechanism which will be described later are indicated by dashed lines.

In FIGS. 4A and 4B, the lower load port 22a has a lower lid-opening mechanism 32a that is disposed inside the main body 21 to detach the lid 18a of the FOUP 18 facing the FOUP connecting port 24 and move the detached lid 18a in a downward direction in FIGS. 4A and 4B. The upper load port 22b has an upper lid-opening mechanism 33a that is disposed inside the main body 21 to detach the lid 18a of the FOUP 18 facing the FOUP connecting port 24 and move the detached lid 18a in an upward direction in FIGS. 4A and 4B.

The lower lid-opening mechanism 32a includes: a coupling portion 32b to be coupled to the lid 18a; a rod 32c, which is connected to the coupling portion 32b to extend and contract in the height direction; a driving unit 32d for driving the rod 32c. The upper lid-opening mechanism 33a includes a coupling portion 33b to be coupled to the lid 18a; a rod 33c, which is connected to the coupling portion 33b to extend and contract in the height direction; and a driving unit 33d for driving the rod 33c.

In case two lower load ports 22a are arranged on top of one another in the height direction, the lower lid-opening mechanism 32a of the upper one of the two lower load ports 22a needs to be provided above the lower one of the two lower load ports 22a. Since the FOUP connecting port 24 of the lower load port 22a is disposed above the lower lid-opening mechanism 32a, the FOUP connecting port 24 of the upper one of the two lower load ports 22a needs to open at the upper portion of the main body 21. However, a space is required near the upper portion of the main body 21 to ensure a moving path of a container transfer unit (not shown) moving in a ceiling container transfer system (not shown). Therefore, it is difficult to dispose the FOUP 18 at the upper portion of the main body 21. As a result, it is difficult to make the FOUP connecting port 24 open at the upper portion of the main body 21. In other words, it is difficult to arrange two lower load ports 22a on top of one another in the height direction due to the limited height in the arrangement of the FOUP connecting port 24.

On the other hand, in the present embodiment, the upper load port 22b having the upper lid-opening mechanism 33a is arranged above the lower load ports 22a. Since the FOUP connecting port 24 of the upper load port 22b is disposed below the upper lid-opening mechanism 33a, it is possible to arrange the upper load port 22b above the lower load port 22a while ensuring a space near the upper portion of the main body 21.

Figure 5A:
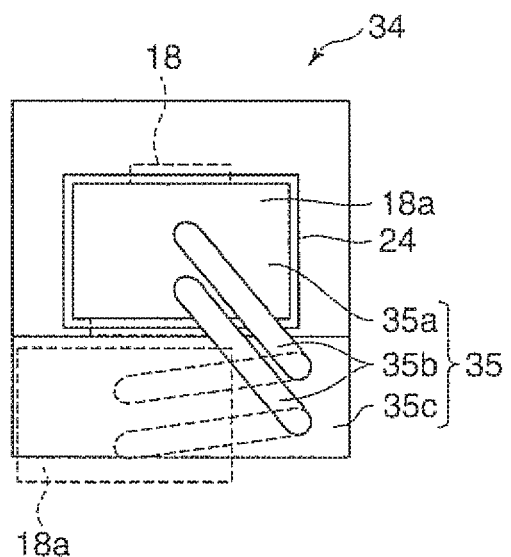
Figure 5B:
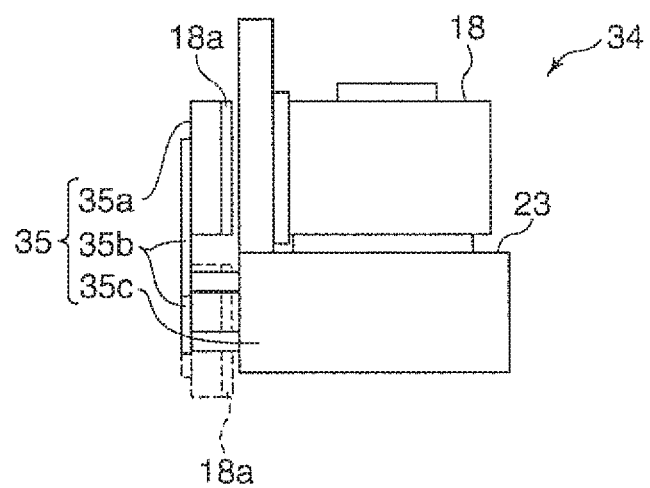

FIGS. 5A and 5B schematically show a configuration of a modification of the upper load port. FIG. 5A is a rear view and FIG. 5B is a side view. In FIGS. 5A and 5B, the main body is omitted, and the lid-open-state is indicated by dashed lines.

In FIGS. 5A and 5B, the upper load port 34 has a lid-opening mechanism 35, in addition to the FOUP connecting port 24, the stage 23 and the like, which is disposed inside the main body 21 to detach the lid 18a of the FOUP 18 facing the FOUP connecting port 24 and move the detached lid 18a in an inclined downward direction in FIG. 5A.

The lid-opening mechanism 35 includes: a coupling portion 35a to be coupled to the lid 18a; two swing arms 35b connected to the coupling portion 35a and arranged in parallel to each other in the height direction; and a driving unit 35c for driving the two swing arms 35b. Each of the two swing arms 35b swings about one end thereof on a plane in the height direction (vertical plane), thereby moving the coupling portion 35a together with the lid 18a in the inclined downward direction in FIG. 5A.

Meanwhile, in the lower lid-opening mechanism 32a, the rod 32c needs to be extended in a height direction by a distance greater than or equal to the height of the lid 18a in order to remove the lid 18a from the FOUP connecting port 24 and open the FOUP connecting port 24. Further, the rod 32c and the driving unit 32d need to be arranged linearly along the height direction in order to drive the rod 32c in the height direction. Thus, the lower lid-opening mechanism 32a requires a predetermined length in the height direction. However, in the lid-opening mechanism 35, the lid 18a is removed by swing operation of the two swing arms 35b. Therefore, it is unnecessary to arrange the driving unit 35c and the two swing arms 35b linearly along the height direction. Accordingly, the length of the lid-opening mechanism 35 in the height direction does not need to be as large as that of the lower lid-opening mechanism 32a.

As a result, the upper load port 34, instead of the upper load port 22b, can be arranged above the lower load ports 22a while ensuring a space near the upper portion of the main body 21.

In accordance with the loader module 15 serving as the substrate transfer chamber of the present embodiment, the lid-opening mechanisms 33a and 35 of the respective upper load ports 22b and 34 remove the lid 18a of the FOUP 18 from the FOUP connecting port 24 in an upward or an inclined downward direction. Therefore, the upper load port 22b or 34 can be arranged above the lower load port 22a in the height direction. In other words, in the loader module 15, the upper load port 22b or 34 can be arranged above the lower load port 22a in the height direction, and thus it is unnecessary to expand the main body 21 in the width direction to install a plurality of load ports 22. Accordingly, the increase in the foot print of the loader module 15 can be reduced.

In the above-described loader module 15, a plurality of load ports 22 is separately arranged at the side surfaces 21a to 21c of the main body 21. Hence, it is unnecessary to expand only one side surface of the main body 21 in the width direction to install the plurality of load ports 22.

Further, in the above-described loader module 15, two FOUP transfer units 26, each having an extensible/contractible arm 30, are disposed at the corner 21d formed by the side surfaces 21a and 21b and the corner 21e formed by the side surfaces 21a and 21c. Hence, the FOUP 18 can be smoothly transferred to each of the load ports 22 even in case where the load ports 22 are separately arranged at the side surfaces 21a to 21c.

While the embodiments of the present invention have been described, the present invention is not limited to the above embodiments.

Figure 6:
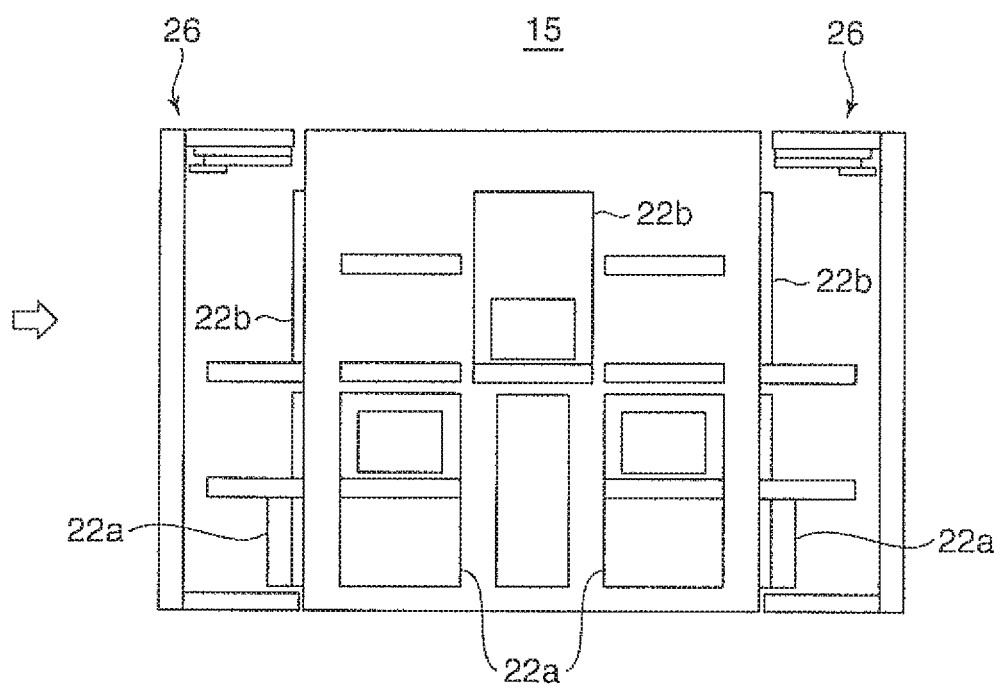
FIG. 6 is a front view schematically showing a configuration of the modification of the loader module.
Figure 7:
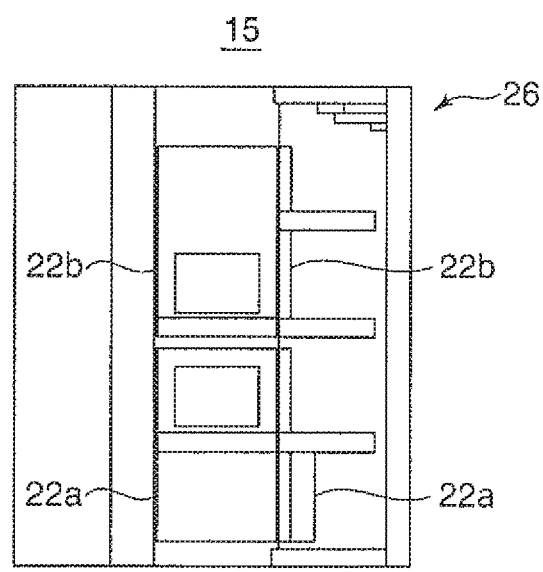
FIG. 7 is a side view schematically showing the modification of the loader module, as seen from a direction of an arrow in FIG. 6.

For example, the load module 15 does not necessarily have eight load ports 22. The number of load ports 22 may be at least greater than or equal to the number of process modules 13. For example, as shown in FIGS. 6 and 7, the loader module 15 may have seven load ports 22. In this case, two lower load ports 22a and one upper load port 22b are arranged at the side surface 21a.

While the invention has been shown and described with respect to the embodiments, it will be understood by those skilled in the art that various changes and modifications may be made without departing from the scope of the invention as defined in the following claims.

What is claimed is:

1. A substrate transfer chamber operable to be coupled to containers that are configured to accommodate substrates and unload substrates from the containers, the substrate transfer chamber comprising:
   a main body configured as a housing comprising a plurality of outer walls that enclose a space in the substrate transfer chamber; and
   a plurality of container connecting mechanisms disposed on the housing and configured to be coupled to the containers, the container connecting mechanisms comprising a first container connecting mechanism and a second container connecting mechanism,
   wherein, in the main body, the first container connecting mechanism is arranged on top of the second container connecting mechanism in a vertical direction of the housing when the substrate transfer chamber is positioned for an operation,
   wherein the first container connecting mechanism comprises:
   a first container connecting port configured to be coupled to a first container with a first lid; and
   a first lid-opening mechanism configured to detach the first lid from the first container in a state that the first container is coupled to the first container connecting port,
   wherein the second container connecting mechanism comprises:
   a second container connecting port configured to be coupled to a second container with a second lid; and
   a second lid-opening mechanism configured to detach the second lid from the second container in a state that the second container is coupled to the second container connecting port, wherein the first lid-opening mechanism is configured to move a detached first lid from the first container connecting port in an upward direction, and wherein the second lid-opening mechanism is configured to move a detached second lid from the second container connecting port in a downward direction, wherein the substrate transfer chamber further comprises container transfer units configured to transfer the containers to the plurality of container connecting mechanisms, wherein each container transfer unit comprises an arm that is extendable and contactable, wherein adjoining outer walls of the plurality of outer walls of the housing form two angulated corner portions of the housing when viewed from above, and wherein two of the container transfer units are disposed outside the space enclosed by the plurality of outer walls and affixed to the adjoining outer walls and respectively face the two angulated corner portions.

2. The substrate transfer chamber of claim 1, further comprising buffers configured to temporarily place thereon the containers.

3. The substrate transfer chamber of claim 1, further comprising buffers configured to temporarily place thereon the containers.

4. The substrate transfer chamber of claim 1, wherein the first container connecting mechanism and the second container connecting mechanism are physically separated.

5. The substrate transfer chamber of claim 1, wherein the first container connecting mechanism further comprises a buffer configured to temporarily place thereon one of the containers, the buffer extending in a horizontal direction and disposed above the first container connecting port.

* * * * *